(12) United States Patent
Ahmed et al.

(10) Patent No.: US 8,957,734 B2
(45) Date of Patent: Feb. 17, 2015

(54) AMPLIFIER CALIBRATION

(71) Applicants: Abdulrhman M. S. Ahmed, Gilbert, AZ (US); Paul R. Hart, Phoenix, AZ (US); Ramanujam Shinidhi Embar, Chandler, AZ (US)

(72) Inventors: Abdulrhman M. S. Ahmed, Gilbert, AZ (US); Paul R. Hart, Phoenix, AZ (US); Ramanujam Shinidhi Embar, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/464,270

(22) Filed: Aug. 20, 2014

(65) Prior Publication Data

US 2014/0354362 A1   Dec. 4, 2014

Related U.S. Application Data

(63) Continuation of application No. 14/152,081, filed on Jan. 10, 2014, now Pat. No. 8,816,767, which is a continuation of application No. 13/656,551, filed on Oct. 19, 2012, now Pat. No. 8,653,890.

(51) Int. Cl.
  *H03F 3/68*  (2006.01)

(52) U.S. Cl.
  USPC .................. 330/295; 330/124 R; 330/107

(58) Field of Classification Search
  USPC .................................. 330/295, 124 R, 107
  IPC ........................................................ H03F 3/68
  See application file for complete search history.

(56) References Cited

U.S. PATENT DOCUMENTS

| | | | | |
|---|---|---|---|---|
| 5,594,385 | A  * | 1/1997  | Anvari ........................... | 330/149 |
| 7,167,693 | B2 * | 1/2007  | Bachman et al. ........... | 455/127.1 |
| 7,598,805 | B2 * | 10/2009 | Staudinger et al. ........ | 330/124 R |
| 7,626,455 | B2 * | 12/2009 | Ito et al. ........................ | 330/149 |
| 8,493,143 | B2 * | 7/2013  | Khilia et al. .................. | 330/149 |
| 8,736,365 | B2 * | 5/2014  | Correa et al. ................. | 330/149 |
| 2010/0156528 | A1 * | 6/2010 | Couchman et al. ....... | 330/124 R |

* cited by examiner

*Primary Examiner* — Patricia Nguyen (57) ABSTRACT

A system and method of calibrating an amplifier are presented. The amplifier has a first amplification path and a second amplification path. A first state of the amplifier is identified defining a first phase shift of the first path and a second phase shift of the second path resulting in a maximum efficiency of the amplifier when an attenuation of the first path and an attenuation of the second path are set to first attenuation values. The attenuation of the first path and the attenuation of the second path is set to achieve a maximum efficiency of the amplifier when the phase shift of the first path and the phase shift of the second path are set according to the first state.

20 Claims, 5 Drawing Sheets

AMPLIFIER CALIBRATION

CROSS-REFERENCE TO RELATED APPLICATIONS

This application is a continuation of U.S. patent application Ser. No. 14/152,081 filed on Jan. 10, 2014 and entitled "AMPLIFIER CALIBRATION", which is a continuation of U.S. patent application Ser. No. 13/656,551 filed on Oct. 19, 2012 and entitled "AMPLIFIER CALIBRATION," which are each incorporated herein by reference.

FIELD OF THE INVENTION

Embodiments of the inventive subject matter relate to calibration of an amplifier in general and more specifically to techniques and apparatus for calibration of a power splitter, where the power splitter includes an adjustable attenuation and phase state and operates in conjunction with a dual-path amplifier, such as a Doherty amplifier.

BACKGROUND OF THE INVENTION

Doherty amplifiers are amplifiers commonly used in wireless communication systems. Today, for example, Doherty amplifiers are used increasingly in base stations that enable the operation of wireless communications networks. Doherty amplifiers are suitable for use in such applications because the amplifiers include separate amplification paths, typically a carrier path and a peaking path. The two paths are configured to operate at different classes. More particularly, the carrier amplification path typically operates in a class AB mode and the peaking amplification path is biased such that it operates in a class C mode. This enables improved power-added efficiency and linearity of the amplifier, as compared to a balanced amplifier, at the power levels commonly encountered in wireless communications applications.

Generally, a power splitter supplies the input signals to each amplification path in the Doherty amplifier. Power splitters or signal splitters or dividers are known and used, as the name suggests, to divide or split a signal into two or more identical signals. When used in conjunction with a Doherty amplifier, it is important that the attenuation and phase state of each path in the power splitter be properly calibrated for a desired operation of the Doherty amplifier. Because each path can include a very large number of possible attenuation and phase states, it is impractical to inspect the operation of the amplifier at each possible combination of attenuation and phase states in order to identify the optimum calibration.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

DETAILED DESCRIPTION

In overview, the present disclosure describes embodiments of methods and systems for calibration of an amplifier in general and more specifically techniques and apparatus for calibration of a power splitter, where the power splitter includes an adjustable attenuation state and phase state. As used herein, an "attenuation state" refers to a distinct combination of attenuation levels applied to an input signal by attenuators along multiple amplification paths, where the attenuation levels fall within a range of attenuation levels supported by the system. The range of attenuation levels may be divided into increments, where the attenuators may be set to some or all of the incrementally different attenuation levels in assessing performance of the amplifier (e.g., during a sweep through the attenuation states), as will be described later. Similarly, a "phase state" refers to a distinct combination of phase shifts applied to an input signal by phase shifters along multiple amplification paths, where the phase shifts fall within a range of phase shifts supported by the system. The range of phase shifts may be divided into increments, where the phase shifters may be set to some or all of the incrementally different phase shift values in assessing performance of the amplifier (e.g., during a sweep through the phase shift states), as will be described later. The power splitter is used in conjunction with a dual-path amplifier, such as a Doherty power amplifier. More particularly, various inventive concepts and principles embodied in methods and apparatus corresponding to adjustable power splitters suitable for use in amplifiers for improved efficiency and performance, and so on, will be discussed and disclosed. In the present disclosure, embodiments of the system are described in conjunction with a Doherty amplifier, though it should be appreciated that in the present disclosure the Doherty amplifier may be replaced by an alternative dual-path amplifier, in other embodiments.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

Doherty amplifiers are used in a number of wireless applications, as the amplifiers enable high efficiency over a wide output power range and can achieve a desired linearity using various linearization schemes. In many implementations, Doherty amplifiers include two amplifiers, a first carrier (or main) amplifier, and a second peaking amplifier. In a symmetric Doherty amplifier, the carrier and peaking amplifiers are the same size. Symmetric Doherty amplifiers are commonly used today, but asymmetric Doherty amplifiers that employ a peaking amplifier that is larger than the carrier amplifier offer the potential for additional efficiency improvements.

In a Doherty amplifier, the input signal is split at an input or power splitter between the carrier and peaking amplification path or circuit. The signals are then separately amplified by the carrier and peaking amplifiers of the Doherty amplifier and combined at an output stage. When combining the outputs of the carrier and peaking amplifiers, it may be desired to make minor adjustments in the phase and amplitude or attenuation of the Doherty device's input splitter to provide optimal balancing between the outputs of each path. To facilitate this adjustment, a Doherty amplifier may include an adjustable power divider or splitter that can be used to fine-tune the configuration of the input signals to both the carrier and peaking amplifiers. The adjustable power splitter allows both the attenuation and phase shift of each signal being transmitted to each path of the Doherty amplifier to be separately adjusted.

When using such an adjustable power divider, however, there are a large number of possible configurations for the attenuation and phase shifts or phase states of each path. For example, in a conventional Doherty amplifier having a carrier and a peaking path, each with an attenuator having a state defined by four bits and a phase shifter having a state defined by three bits, there are 128×128=16,384 possible states. To properly calibrate such a Doherty amplifier, the performance of the amplifier in each possible state may be tested. However, testing the amplifier performance in each of 16,384 states is very time consuming and inefficient. Additionally, due to the large number of possible combinations, it may be difficult to find an optimum attenuation and phase settings for the desired RF performance of the amplifier using conventional techniques.

The present disclosure, therefore, describes embodiments that provide an approach for calibrating a power splitter that may be used in conjunction with a Doherty amplifier. The various embodiments include calibrating the attenuation and phase states of both the main and peaking paths of the amplifier, so that each path is optimally matched. Moreover, the various embodiments may greatly reduce the number of combinations between attenuation and phase states in each amplification path that may be tested before calibration. The embodiments also may allow further improvement in efficiency as a function of the used linearization quality. As such, the efficiency of the amplifier may be maximized to an extent where the linearization system can correct the nonlinearity of the amplifier, according to various embodiments.

Figure 1:
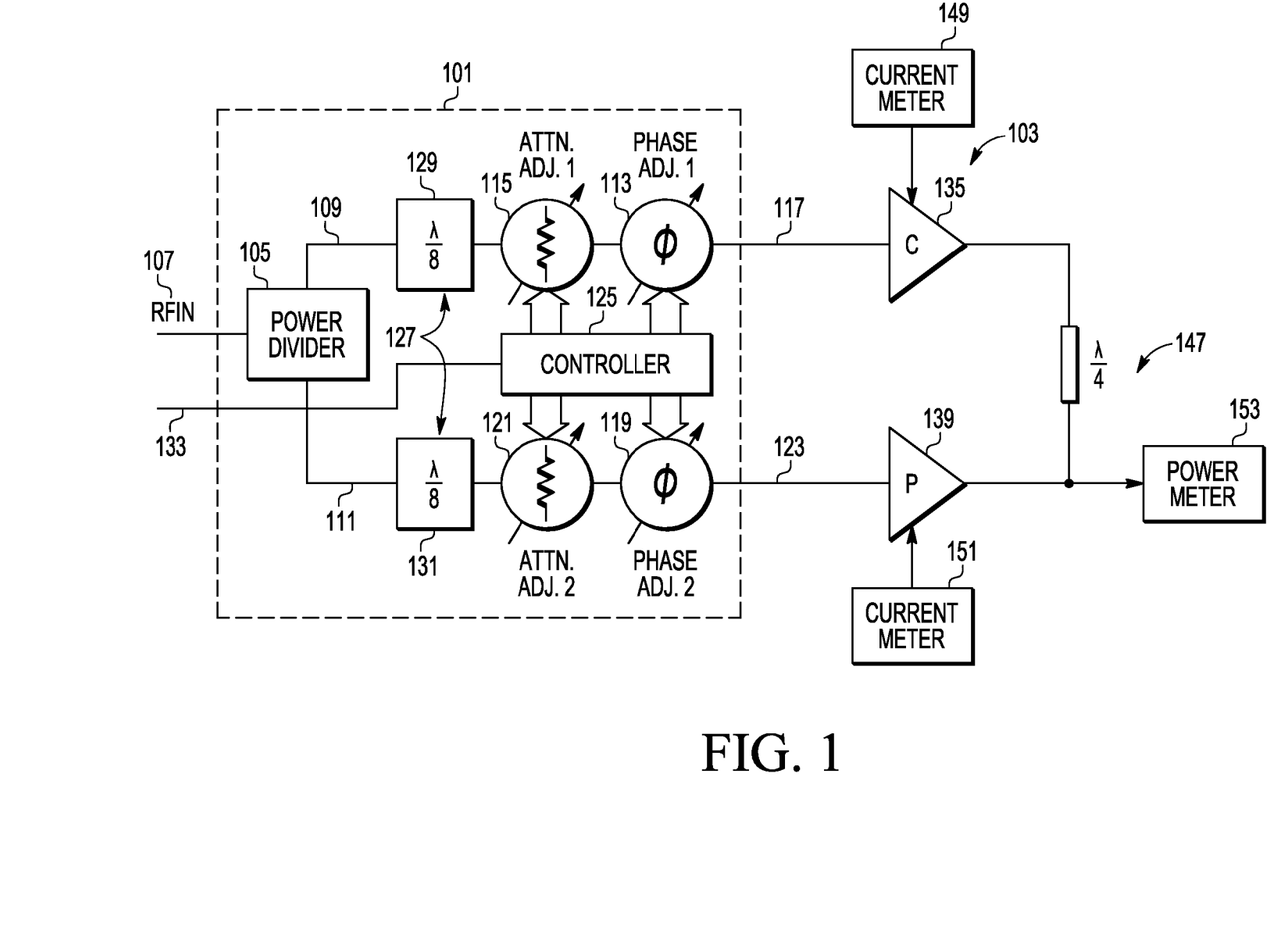
FIG. 1 is a block diagram showing a simplified representation of a system for configuring an adjustable power splitter utilized in conjunction with a Doherty power amplifier system, in accordance with an embodiment.

FIG. 1 shows a simplified and representative high level diagram of an embodiment of a system for configuring an adjustable power splitter utilized in conjunction with a Doherty power amplifier system. In FIG. 1 as shown, an adjustable power splitter 101 or radio frequency power splitter is coupled to or utilized with an amplifier, specifically a Doherty power amplifier 103. The adjustable power splitter 101 essentially divides an input signal into multiple amplification paths, where each amplification path includes an adjustable attenuator (e.g., one of attenuators 115, 121), an adjustable phase shifter (e.g., one of phase shifters 113, 119), and an amplifier (e.g., one of amplifiers 135, 139).

The adjustable power splitter 101 includes a power divider 105 with an input 107 for receiving an input radio frequency signal (RFIN), and first and second divider outputs 109, 111, respectively. In a symmetrical Doherty amplifier, the power divider 105 of FIG. 1 operates to divide or split an input signal received at the input 107 into two signals that are very similar with, in some embodiments, equal power. This equal power form of power divider may be referred to as a 3 decibel (dB) divider when the resultant signals are each 3 dB less than the signal at the input. While a 3 dB divider is typical, other dividers with multiple outputs or outputs with unequal signals could be fashioned and used in some applications, in other embodiments.

Further included in the adjustable radio frequency power splitter 101, as shown in FIG. 1, is a first adjustable phase shifter 113 and a first adjustable attenuator 115, which are series-coupled to the first divider output 109 and configured for providing a first power output 117. It will be appreciated that the adjustable phase shifter and adjustable attenuator can be series-coupled to each other in any order (e.g., attenuator followed by phase shifter as shown or vice versa). Further included in the adjustable radio frequency power splitter 101 is a second adjustable phase shifter 119 and in some embodiments a second adjustable attenuator 121, which are series-coupled to the second divider output 111 and configured for providing a second power output 123. As noted above, the order in which these components are series-coupled to each other can be changed.

In various embodiments of the adjustable power splitter 101, the first and typically the second adjustable phase shifter 113, 119 are each digitally controlled (e.g., by a controller 125) and have a plurality of states. In one or more embodiments, the first adjustable phase shifter 113 and often the second adjustable phase shifter 119, each have eight phase shifted states where each phase shifted state defines a particular phase shift in degrees, although they may have more or fewer phase shifted states, in other embodiments. In one example, the phase shifted states are separated by approximately 6.5 degrees. It will be appreciated that the first and second adjustable phase shifters 113, 119 may have different phase shifted states, cover different ranges, and have different steps sizes from one another, although typically they will be essentially the same. While digitally controlled, the adjustable phase shifters in many embodiments are analog phase shifters.

In various embodiments of the adjustable power splitter 101, the first and typically the second adjustable attenuator 115, 121 are each digitally controlled (e.g., by controller 125) and have a plurality of attenuation levels where the attenuation levels are separated by a number of dB (in one 0.5 dB separates the attenuation levels). In one or more embodiments, the first adjustable attenuator 115 and often the second adjustable attenuator 121, each have eight attenuation states or attenuation levels, although they may have more or fewer attenuation states or attenuation levels, in other embodiments. It will be appreciated that the first and second attenuation may have different attenuation states, cover different attenuation ranges, and have different attenuation steps sizes from one another, although typically they will be essentially the same. While digitally controlled, the adjustable attenuators in many embodiments are analog attenuators.

Some embodiments of the adjustable power splitter 101 further include an optional fixed phase shifter 127 that is configured for adding a fixed phase shift between first and second signals at the, respectively, first and second power outputs 117, 123. In some embodiments, this can be a fixed and predetermined phase shift (e.g., 90 degrees) added to one amplification path (e.g., the amplification path between output 109 and power output 117, or the amplification path between output 111 and power output 123).

In certain applications (e.g., within Doherty amplifier 103), a ninety degree phase shift is added to one path in the amplifier, and the fixed phase shift can be used to offset this amplifier phase shift. The fixed phase shift in some embodiments includes a phase shift in a negative or positive direction (e.g., a negative shift $\lambda/8$ 129, such as a negative forty five degree shift) for the first signal at the first power output 117, and a phase shift in the opposite direction (e.g., a positive shift $\lambda/8$ 131 such as a positive forty five degree phase shift) for the second signal at the second power output 123. Using the opposite-signed, forty five degree phase shifts yields a ninety degree relative phase shift between the signals at the power outputs 117, 123. The phase shifter 127 (or negative shift 129 and positive shift 131) can be lumped element circuits having an inductive and a capacitive reactance, according to an embodiment, as will be further discussed below with reference to FIG. 2.

The controller 125 is configured and arranged for controlling the adjustable phase shifters 113, 119 and adjustable attenuators 115, 121 of the adjustable power splitter 101. For example, controller 125 may be configured to calibrate the adjustable power splitter 101 in accordance with the methods described in the present disclosure. For data communications, the controller 125 includes an input 133 (or input/output) that is coupled to a data interface (e.g., a serial interface such as a serial peripheral interface (SPI), not illustrated). The data interface (e.g., the SPI) may be implemented on the same integrated circuit chip as the power splitter 101 (e.g., a single silicon or gallium-arsenide chip), or the data interface and the power splitter 101 may be implemented on different integrated circuit chips (e.g., two silicon chips, two gallium-arsenide chips, or a combination of one silicon chip (e.g., for the SPI) and one gallium-arsenide chip (e.g., for the power splitter 101)).

Generally, the attenuators 115, 121 and/or phase shifters 113, 119 are controlled using a number of switches, typically solid state or integrated switches such as those implemented as transistors. Thus, the controller 125 can be provided state information for all switches in all attenuators 115, 121 and phase shifters 113, 119, and the controller 125 essentially acts as one or more latching buffers with outputs arranged and coupled to ensure that all switches are in the appropriate ON or OFF state. Alternatively, the controller 125 can be provided an encoded value (e.g., a binary value) or two or more encoded values, wherein each of the encoded values uniquely specify a state for each attenuator 115, 121 and phase shifter 113, 119. For example, if all phase shifters 113, 119 and attenuators 115, 121 are 8 state devices, a 3 bit encoded value for each could be used to uniquely specify a particular state. Accordingly, during operation, 4 such encoded values could be provided to the controller 125 (e.g., one for each attenuator 115, 121, and one for each phase shifter 113, 119). The controller 125 may then convert each encoded value to the appropriate control signals (e.g., switch control signals) for each attenuator 115, 121 and phase shifter 113, 119, and latch in these values. In other embodiments, the amount of phase shift and attenuation for each of the four devices 113, 115, 119, 121 could be sent to the controller 125, and the controller 125 could determine the proper state to realize the desired shifts and attenuations. In another alternate embodiment, the controller 125 may receive an address or offset, and may look up the phase state and/or attenuator state information in a lookup table (not illustrated) based on the received address or offset.

The Doherty amplifier 103 includes a main or carrier amplifier 135 coupled via a matching network or circuit (not illustrated) to the first power output 117 and a peaking amplifier 139 coupled by via matching network or circuit (not illustrated) to the second power output 123. As will be appreciated by those of ordinary skill based on the description herein, the main and peaking amplifiers 135, 139 may be comprised of one or more stages of relatively low power level amplification and relatively high power level amplification.

The carrier and peaking amplifiers 135, 139 are coupled via respective output matching circuits (not illustrated) to a Doherty combiner 147, which is configured such that the carrier amplifier 135 provides the amplification for lower level signals, and both amplifiers 135, 139 operate in combination to provide the amplification for high level signals. This may be accomplished, for example, by biasing the carrier amplifier 135, such that it operates in a class AB mode, and biasing the peaking amplifier 139 such that it operates in a class C mode. More complex embodiments are possible in which the adjustable power splitter 101 has three outputs, and the Doherty amplifier 103 has a main and two peaking amplifiers, with each peaking amplifier biased in different class C operating points. In such an embodiment, the power splitter 101 may include three amplification paths (each including an adjustable phase shifter and an adjustable attenuator). In one or more of these manners, overall efficiency/linearity of the amplifier can be improved over a relatively wide range of signal levels. Adjustments to the adjustable attenuators 115, 121 and adjustable phase shifters 113, 119 can be made in an experimental manner by monitoring power drawn by the peaking stage 139 or main stage 135 or both as a function of input signal levels and the like. At certain input signal levels, the peaking amplifier 139 should begin to operate, and amplitude and phase adjustments can be made with this in mind.

As shown in FIG. 1, and according to an embodiment, current meters 149 and 151 are connected, respectively, to the current conducting terminals (e.g., drains) of carrier amplifier 135 and peaking amplifier 139. Current meters 149 and 151 are configured to measure a current flow through each path of the Doherty amplifier 103. A power meter 153 is also connected to the output of the Doherty amplifier 103, in an embodiment. The power meter 153 is configured to measure both average power generated by the Doherty amplifier 103 as well as a peak-to-average power ratio (PAR) of the amplifier 103, or, as an alternative, measure only the peak power generated by the amplifier. During calibration of the adjustable power splitter 101, measurements produced by current meters 149 and 151 and power meter 153 are used in identifying an optimized configuration of each of the adjustable attenuators 115, 121 and the adjustable phase shifters 113, 119.

In some embodiments of the present system, the controller 125 is configured to execute an algorithm for calibrating the adjustable power splitter 101. In that case, the controller 125 can be placed in communication with each of current meters 149, 151 as well as power meter 153 to receive data therefrom. The data collected from the meters 149, 151 can then be used in calibrating the adjustable power splitter 101 for a desired operation.

To achieve a desired performance of the amplifier shown in FIG. 1, the power splitter 101, and, specifically, the attenuation and phase states of the power splitter 101, must be correctly calibrated. As used herein, "calibration" refers to setting the attenuation and phase shifters of the power splitter 101 to different attenuation levels and phase shifts, respectively, to determine a configuration of the attenuation levels and phase shifts that results in an optimal or near-optimal performance. Because each of the adjustable attenuators 115, 121 and adjustable phase shifters 113, 119 may have a large number of candidate states, it can be difficult to determine which of those large number of candidate states may achieve the desired amplifier performance.

Embodiments discussed in the present disclosure, therefore, provide approaches for efficiently calibrating a power splitter coupled to and used in conjunction with a Doherty amplifier. The various embodiments allow for determining the optimal or near optimal attenuation and phase values along the carrier and peaking paths of a Doherty amplifier from among a potentially large number of possible phase and attenuation states. The attenuation and phase values are selected to provide efficient amplifier operation that still meets the amplifier's linearization requirements, in an embodiment. As will be described in more detail below, the embodiments efficiently locate the amplifier's optimal or near optimal state, while minimizing or reducing the number of iterations. Furthermore, the embodiments can be used to identify the optimal or near optimal values for attenuation and phase state depending on the desired performance characteristics.

Figure 2:
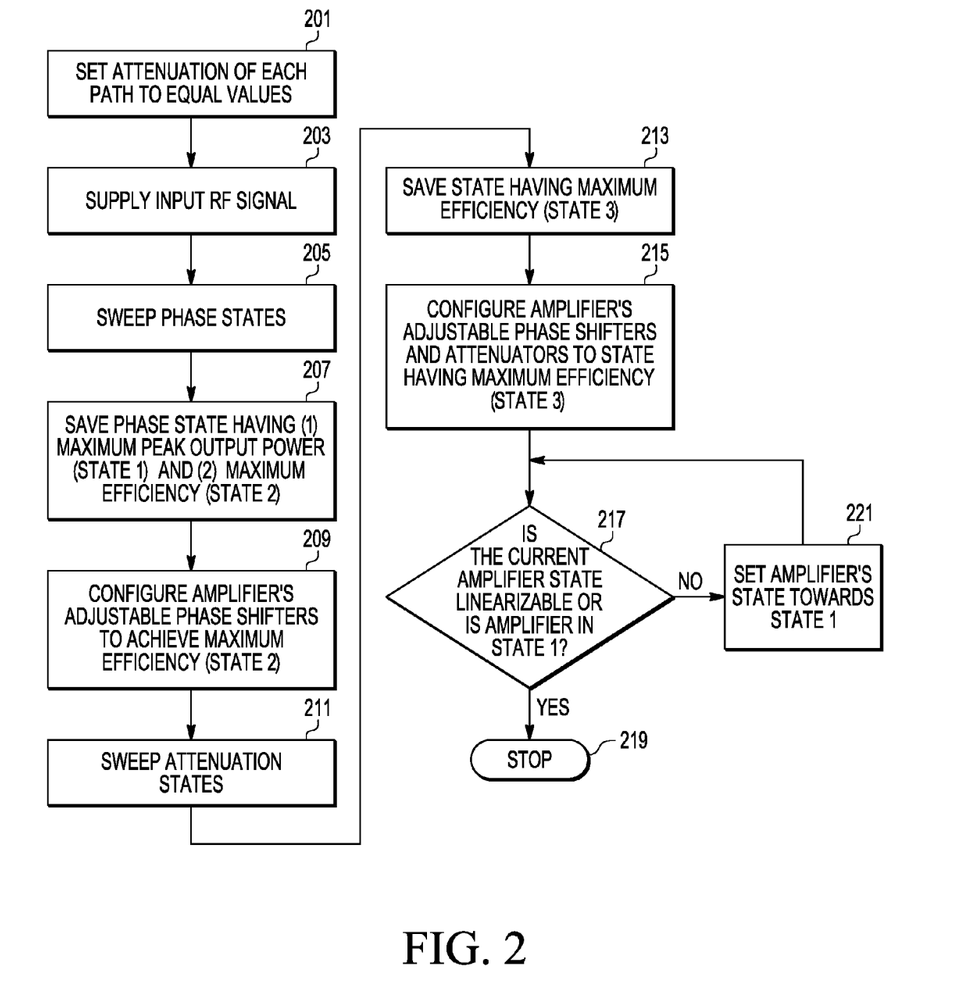
FIG. 2 is a flowchart illustrating a method for calibrating the attenuation and phase state of a power splitter or an amplifier, in accordance with an embodiment.

FIG. 2 is a flowchart illustrating a method for calibrating the attenuation and phase states of a Doherty amplifier (or a power splitter connected thereto) in accordance with an embodiment. The method may be implemented, for example, by controller 125 of FIG. 1. Alternatively, the method can be implemented by any device component or entity having the ability to control the attenuation and phase states of the amplifier's carrier and peaking amplification paths, while also monitoring the output of the amplifier, such as a host computer in communication with adjustable attenuators and phase shifters (e.g., attenuators 115, 121 and phase shifters 113, 119, FIG. 1). For example, the method can be implemented using electronic circuit monitoring devices.

In the case of a symmetrical Doherty amplifier, in step 201 the attenuation of both the carrier and the peaking amplification paths of the amplifier typically are set to be equal to one another. In some cases, this may involve setting the attenuation level applied along each path to 0 dB. With reference to the device of FIG. 1, this may involve setting the attenuation of each of adjustable attenuators 115, 121 of FIG. 1 equal to 0 dB. However in an asymmetrical amplifier, the attenuation of both the carrier and the peaking amplification paths may be set to different values, which correspond to the power ratio between carrier and peaking amplifiers.

With the attenuation level (or state) of each path set in step 201, an input signal (e.g., an RF signal) is supplied to the amplifier in step 203. The input signal may be selected to mimic the input signals that will be fed into the amplifier during normal use. In one embodiment, for example, the input signal mimics a digitally modulated signal commonly encountered in wireless communication applications. In other cases, the input signal may include an arbitrary waveform supplied to the power splitter (e.g., power splitter 101) that drives the amplifier sufficiently to draw current in both the carrier and peaking paths. In one embodiment, the input signal is selected to have sufficient power to achieve a 6-7 dB output back-off.

With the input signal being supplied to the amplifier, in step 205 the phase shifts of the carrier and peaking paths of the Doherty amplifier are swept through a number of possible combinations (e.g., the phase shifters 113, 119 are controlled by controller 125 to apply different combinations of phase shifts to the input signal while the attenuation applied by attenuators 115, 121 is held constant, and the output signal is measured for each combination). Each combination of phase shifts of the carrier and peaking paths may be referred to as a phase state of the amplifier or the power splitter. In one embodiment, step 205 involves sweeping the carrier and peaking paths through all possible phase shift combinations or phase states. In other embodiments, only a subset of available phase states that surround a nominal, or default, phase shift (e.g., in a conventional Doherty amplifier the nominal phase shift is 90 degrees) between paths are swept. For example, if a relative phase sweep of fewer than 180 degrees is considered sufficient (e.g., because such a sweep is considered to cover a sufficient number of different phase states around 90 degrees), it may be sufficient to consider only a subset of the available phase states.

One embodiment for testing combinations of phase states for the device of FIG. 1, for example, may be as follows. The first adjustable phase shifter 113 may be configured to apply a first phase shift (e.g., in response to controller 125 receiving an encoded value corresponding to a first phase shift, such as binary value 000). Then, the second adjustable phase shifter 119 is swept through all of its possible phase shifts (e.g., by cycling through phase shifts corresponding to binary values 111 to 000 (from maximum phase to minimum phase), or some subset thereof). During the sweep, each phase state is considered a "candidate phase state." Once the sweep is complete, the second adjustable phase shifter 119 is set to a second phase shift (e.g., a phase shift corresponding to binary value 000). Then, the first adjustable phase shifter 113 is swept through all of its possible phase shifts (e.g., by cycling through phase shifts corresponding to binary values 001 to 111, or some subset thereof). Again, during the sweep, each phase state is considered a "candidate phase state." As such, the phase shifts applied by the first and the second adjustable phase shifters are swept around a desired phase shift range (e.g., around 90 degrees).

During the execution of step 205, when the first and second adjustable phase shifters 113, 119 are set in each candidate phase state, the current (e.g., drain current) through each path in the amplifier, and the output power and PAR of the output signal from the amplifier are measured. In one embodiment, the output power and PAR of the output signal are captured by power meter 153, while the currents of each path are captured by current meters 149 and 151. Having captured that data, the amplifier's efficiency can be calculated for each phase state using the output power and the total current values. In one example calculation, the amplifier's efficiency equals Pout/Pdiss; where Pout equals measured output power and Pdiss (the dissipated power on the amplifier) equals Vd*I, where Vd equals drain voltage, and I equals total measured drain current.

Then, having captured the output power, drain currents of each path, PAR of the output signal, and amplifier efficiency for each candidate phase state, a pair of phase states are identified and stored in step 207. First, the phase state of the Doherty amplifier that resulted in the maximum peak output power is stored as State 1. State 1, therefore, is defined by the phase shift of both the first and second adjustable phase shifters that resulted in the amplifier having the maximum peak output power with zero attenuation on each path. Second, a phase state of the Doherty amplifier that resulted in the most efficient output of the amplifier (or maximum efficiency) is saved as state State 2. State 2, therefore, defines the phase shifts of both the first and second adjustable phase shifters that resulted in the amplifier having the most efficient output with zero attenuation on each path. Each of States 1 and 2, therefore, define particular attenuation and phase calibrations of the amplifier for various performance criteria.

Figure 3A:
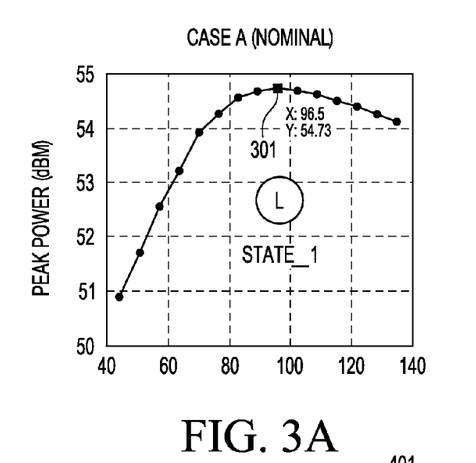
FIGS. 3A-3B are graphs showing a measured amplifier peak power as a function of phase shift.
Figure 3B:
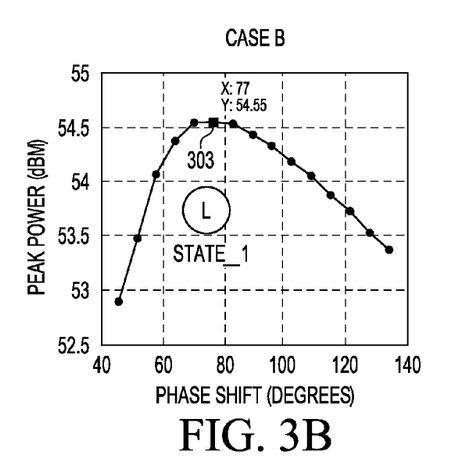
Figure 4A:
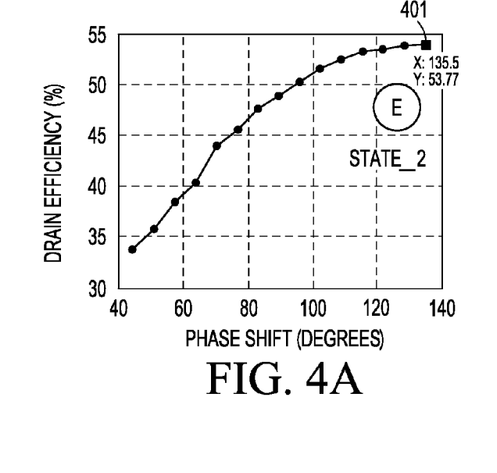
FIGS. 4A-4B are graphs showing a measured amplifier efficiency as a function of phase shift.
Figure 4B:
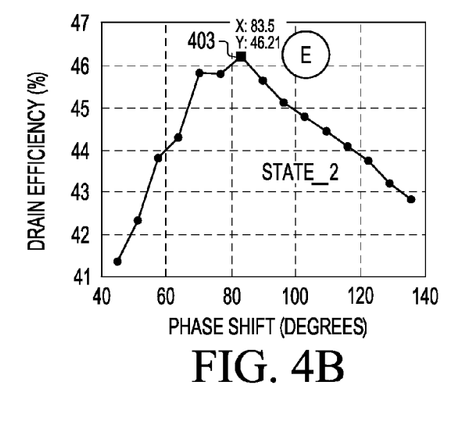
Figure 5A:
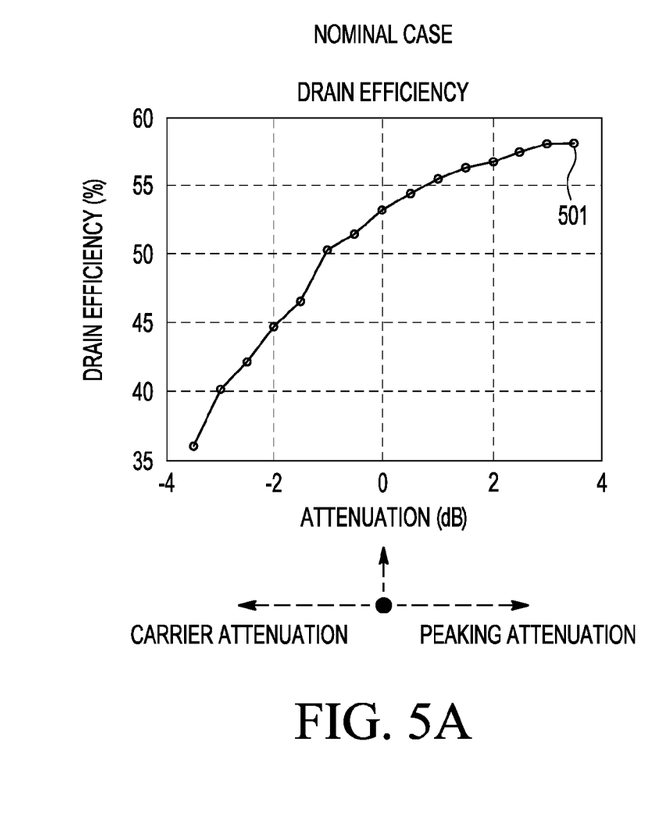
FIGS. 5A-5B are graphs showing a measured amplifier efficiency as a function of attenuation.
Figure 5B:
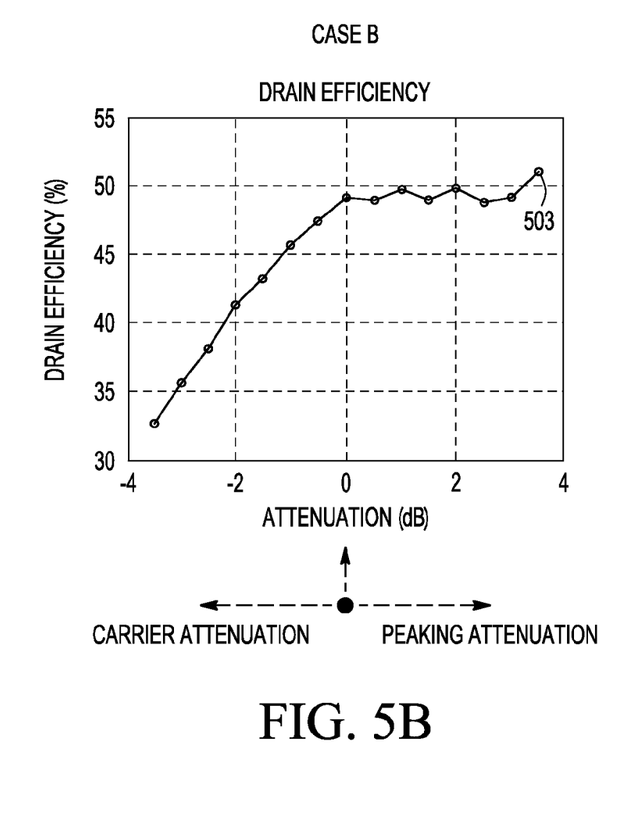

FIGS. 3A, 4A, and 5A show experimental data for a nominal amplifier device. In a nominal device the components of the amplifier (and, specifically, the transistors making-up each amplifier path) are well-balanced against one another allowing for efficient operation of the amplifier, thus providing good efficiency, linearity and peak power. Conversely, FIGS. 3B, 4B, 5B show experimental data for a device comprising a number of poorly matched components. In a non-nominal device, the transistors making up each amplifier path may exhibit the maximum manufacturing variation, resulting in poor amplifier performance. As such, the figures show a somewhat worst-case scenario. FIGS. 3A-3B and 4A-4B are graphs illustrating sample data that may be captured during the execution of steps 205 and 207 of the method depicted in FIG. 2.

FIGS. 3A and 3B each depict a measured amplifier peak power as a function of phase state (e.g., indicating phase shift between the carrier and peaking paths of the amplifier). The measurement of peak power can be used to provide information regarding the amplifier's linearity, as the amplifier's linearity is proportional to the measured peak power. As such, a high peak power indicates good linearity. In each set of test results, pursuant to step 205 of FIG. 2, the phase state of the amplifier has been swept through a number of potential phase shifts about the nominal 90 degree phase shift between the carrier and peaking paths, while the attenuation of each path has been fixed. At each candidate phase state, the amplifier peak power has been measured. Then, pursuant to step 207 of FIG. 2, the phase state giving rise to the highest peak power has been identified. This point defines State 1, described above. In FIG. 3A, for the nominal amplifier, point 301 indicates the peak power of the amplifier at a phase shift between the carrier and peaking paths of approximately 96.5 degrees. Similarly, in FIG. 3B, for the non-nominal amplifier, point 303 indicates the peak power of the amplifier at a phase shift between the carrier and peaking paths of approximately 77 degrees.

FIGS. 4A and 4B each depict measured amplifier efficiency as a function of phase state. In each set of test results, pursuant to step 205 of FIG. 2, the phase state of the amplifier has been swept through a number of potential phase states about the nominal 90 degree phase shift between the carrier and peaking paths. At each candidate phase state, the amplifier efficiency has been evaluated. Then, pursuant to step 207 of FIG. 2, the phase state giving rise to the highest efficiency has been identified. This point defines State 2, described above. In FIG. 4A, for the nominal amplifier, point 401 indicates the maximum efficiency of the amplifier at a phase shift between the carrier and peaking paths of approximately 135.5 degrees. Similarly, in FIG. 3B, for the non-nominal amplifier, point 403 indicates the peak power of the amplifier at a phase shift between the carrier and peaking paths of approximately 83.5 degrees.

Returning to the method of FIG. 2, with the most efficient phase state and maximum peak output power phase state determined, the adjustable phase shifters of the power splitter of the Doherty amplifier are configured in accordance with State 2 (maximum efficiency) in step 209. In an alternate embodiment, the adjustable phase shifters may be configured in accordance with a state corresponding to some other performance criteria. Then, in step 211, with the phase shifts of the carrier and peaking paths invariant, the attenuation states of the amplifier's carrier and peaking paths are swept. Depending upon the implementation, this may involve sweeping only the attenuation levels applied along a single path (e.g., the peaking path). In other implementations, all possible attenuation states including all possible combinations of attenuation levels of the carrier path in combination with the peaking path are swept.

With reference to FIG. 1, for example, when sweeping only a single path (e.g., the peaking path), if adjustable attenuator 115 has a number of different attenuation levels corresponding to encoded binary values having 4 bits, only the 15 possible attenuation levels are swept, or some subset thereof. In that case, when sweeping the candidate attenuation levels of the peaking path, the attenuation of the carrier path is set to 0 dB allowing for optimum efficiency of the amplifier. This approach results in fewer data points to analyze (e.g., the number of data points will be equal to the number of potential states of the adjustable attenuator in the peaking path), resulting in a more efficient analysis.

However, when sweeping the attenuation states corresponding to all possible attenuation levels on both paths, if each of adjustable attenuators 115 and 121 has attenuation levels defined by 4 bits, then each attenuator has 16 possible attenuation levels. In that case, the adjustable attenuators of the carrier and peaking paths, in combination, have a total of 256 possible attenuation levels. In step 211, the adjustable attenuators are swept through each one of those attenuation states. In an alternate embodiment, the adjustable attenuators may be swept through a subset of all possible attenuation states.

One embodiment for testing each candidate attenuation state may be as follows. The first adjustable attenuator 115 may be configured to a first attenuation level (e.g., in response to controller 125 receiving an encoded value corresponding to a first attenuation level defined by binary value 0000). Then, the second adjustable attenuator 121 could be swept through all of its possible attenuation levels (e.g., by cycling through attenuation levels corresponding to binary values 0000 to 1111, or some subset thereof). During the sweep, each combination of attenuation levels of the first adjustable attenuator 115 and the second adjustable attenuator 121 is considered a "candidate attenuation state." Once the sweep is complete, the first adjustable attenuator 115 is set to a second attenuation level (e.g., an attenuation level corresponding to binary value 0001). Then, the second adjustable attenuator 121 is swept through all of its possible attenuation levels (e.g., by cycling through attenuation levels corresponding to binary values 0000 to 1111, or some subset thereof). Again, during the sweep, each combination of attenuation levels of the first adjustable attenuator 115 and the second adjustable attenuator 121 is considered a candidate attenuation state. This process could be repeated until the first adjustable attenuator 115 reaches its final attenuation level (e.g., an attenuation level corresponding to binary value 1111).

During the execution of step 211, when the first and second adjustable attenuators shifters 115, 121 are set in each candidate attenuation state, the current (e.g., drain current) through each path in the amplifier, and the output power and PAR of the output signal from the amplifier are measured. In one embodiment, the output power and PAR of the output signal are captured by power meter 153, while the currents of each path are captured by current meters 149 and 151. Having captured that data, the amplifier's efficiency can be calculated for each attenuation state using the output power and the total current values. Then, pursuant to step 213 of FIG. 2, a third state (State 3) is identified in step 213 that results in the amplifier maximum efficiency. State 3, therefore, is defined by the attenuation level of both the first and second adjustable attenuators that resulted in the amplifier having the maximum efficiency, where the phase state of each path in the amplifier has been fixed according to State 2. During the attenuation sweep, in one embodiment, the swept attenuation range may be limited to half (or some other percentage) of the available ranges of each attenuator.

FIGS. 5A-5B are graphs illustrating sample data that may be captured during the execution of steps 211 and 213 of the method depicted in FIG. 2. FIGS. 5A and 5B each depict measured amplifier efficiency as a function of attenuation states. In each Figure, the X-axis represents attenuation, where negative values represent attenuation of the carrier path, while positive values represent attenuation of the peaking path. In each set of test results, pursuant to step 211 of FIG. 2, the phase state of each path of the amplifier has been held constant in accordance with State 2, as described above. Then, the attenuation state of the amplifier has been swept through a number of candidate attenuation states.

In the examples shown in both of FIGS. 5A and 5B a negative value on the X-axis indicates that the attenuation of the carrier path is set to Y dB (e.g., when the attenuation of the peaking path is set to 0 dB). Conversely, a positive value on the X-axis indicates that the attenuation of the peaking path is set to Y dB (e.g., when the attenuation of the carrier path is set to 0 dB).

In FIG. 5A, for the nominal amplifier, point 501 indicates the peak efficiency of the amplifier at half of the range of attenuation on the peaking path and an attenuation of 0 dB on the carrier path at a phase shift of 135.5 degrees between paths. In FIG. 5B, for the non-nominal amplifier, point 503 indicates the peak efficiency of the amplifier at an attenuation of half of the range of attenuation on the peaking path and an attenuation of 0 dB at a phase shift of 83.5 degrees between paths.

Returning to FIG. 2, the three states, State 1, State 2, and State 3 defined in steps 207 and 213 form the boundary values for the amplifier's attenuation and phase states giving rise to the optimal amplifier configuration. Within those boundary conditions, however, a suitable amplifier configuration may be defined. The suitable configuration may depend, for example, upon the linearization system implemented within the amplifier and the peak output power clipping of the amplifier, among other things.

In general, it is desirable to configure the amplifier in the most efficient state that still provides acceptable linearity. Therefore, as long as the linearization system of amplifier can correct the nonlinearity of the amplifier within the measured three states, the attenuator and phase shifter states are tuned towards a most efficient state (e.g., State 3). On the contrary, if the linearization system is not able to correct nonlinearity, the attenuator and phase shifter states are shifted towards a state having improved linearity over the linearity associated with that of the amplifier when turned towards State 3.

Accordingly, having identified State 3 in step 213, in step 215 the amplifier is configured in accordance with the state defined by State 3. As such, the adjustable phase shifters of the carrier and peaking paths are configured so as to produce the maximum efficiency from the amplifier when both the carrier and peaking paths have the same attenuation, while the adjustable attenuators of both the carrier and peaking path are set to achieve the maximum efficiency given such a phase state, in an embodiment. Then, in step 217, a determination as to whether the current state of the amplifier is linearizable is made. In one embodiment, "linearizable" means that the adjacent channel power ratio (ACPR)) of the amplifier is within an acceptable range. One example range includes the 3GPP Spectrum Emissions Mask for the given signal type. The determination of whether the amplifier is linearizable can be made utilizing the amplifier's linearization system (e.g. digital predistortion). After linearization is performed, if the linearity of the amplifier is within an acceptable range, then the amplifier is considered to be linearizable. The 3GPP Spectrum Emissions Mask is a specification that includes performance parameters that should be met by base stations. If the amplifier is determined to be linearizable, a suitable configuration for the amplifier has been identified and the method ends in step 219 with the amplifier being configured in accordance with State 3.

If, however, the current state of the amplifier is not linearizable, in step 221 the state of the amplifier is transitioned towards the state defined by State 1. This adjustment may be made according to a number of different algorithms. In one example, in step 221 the amplifier's phase state and attenuation state are each adjusted by one increment towards their values in State 1. Alternatively, in step 221 either the attenuation or the phase state may be adjusted towards State 1, while the other state is not adjusted.

After adjusting the state of the amplifier in step 221, it is again determined whether the state of the amplifier is linearizable. This process continues until either the amplifier's state is found to be linearizable or the amplifier reaches the same configuration as that defined by State 1, in which case the amplifier is placed into State 1 and the method is terminated.

Once the method is complete, the amplifier has been optimally configured for its current operating conditions. As those conditions change (e.g., due to variations in temperature, or changes to the types of input signal being supplied to the amplifier), the method of FIG. 2 may be re-executed in order to re-calibrate the amplifier according to its new operating conditions. Once the amplifier is calibrated according to the method of FIG. 2 (and, specifically, once the adjustable attenuators and phase shifters are calibrated), the amplifier can be put into operation.

Additionally, in some cases, by maintaining the maximum efficiency of the Doherty amplifier, care should be taken to circumvent peak signal clipping at the output of the amplifier. Thus by retaining an unclipped output, the algorithm locates the state configuration to obtain best efficiency. Conversely, if the peak power is clipped, the attenuator and phase shifter state is varied to attain better linearity. By sweeping the attenuation in the peaking amplifier path and measuring the average output power and PAR, the peak power can be calculated. By comparing the measured peak power with the peak power capability of the amplifier, it is possible to detect any peak signal clipping caused by sweeping the attenuation. As such, if the clipped signal exceeds a threshold level (e.g., 0.2 dB) the attenuation sweep will be stopped.

Figure 6:
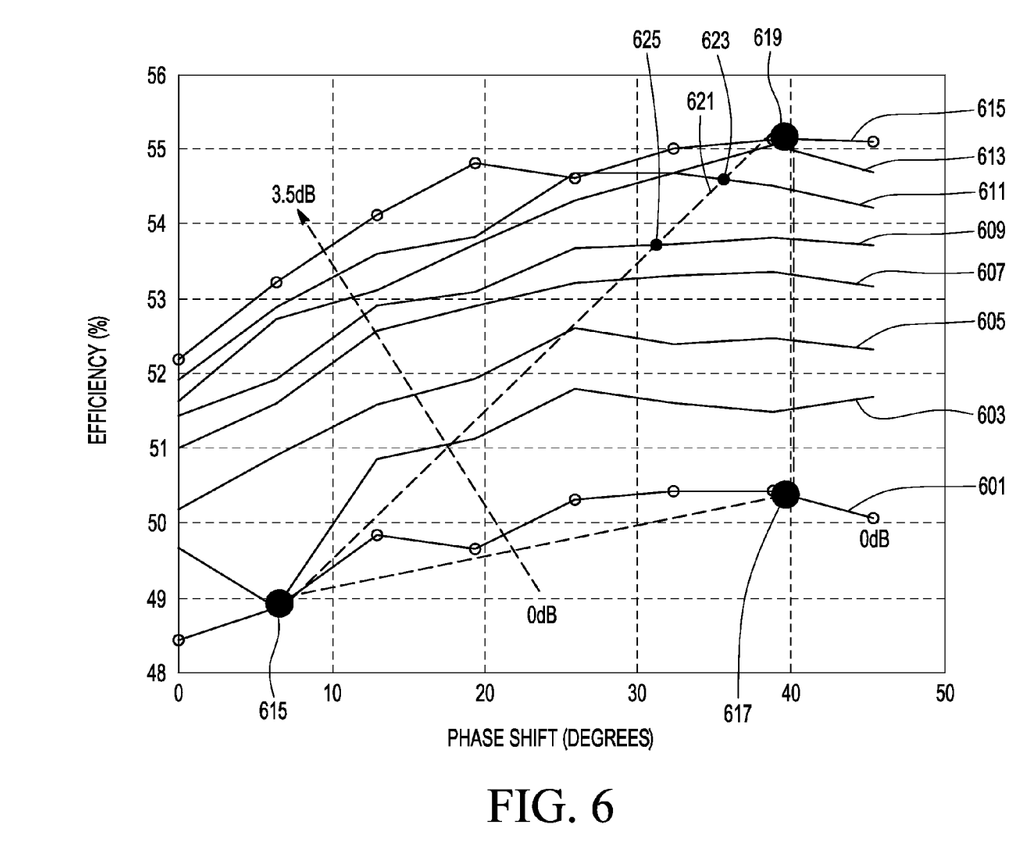
FIG. 6 is a graph showing a measured amplifier as a function of phase shift at a number of distinct attenuation states.

As described above, States 1, 2, and 3 are boundary conditions that define candidate calibrations for the attenuation and phase states of a power splitter of a Doherty amplifier. To illustrate graphically the boundary conditions defined by States 1, 2, and 3, FIG. 6 is a graph that shows the relative position of each State. FIG. 6 depicts sample data that may be captured during the execution of the method depicted in FIG. 2 against a nominal Doherty amplifier. The graph's Y-axis shows amplifier efficiency, while the X-axis shows phase shift of the amplifier (i.e., the relative phase shift between the carrier and peaking paths). FIG. 6 depicts a number of lines that show amplifier efficiency at a number of different attenuation values as a function of phase shift. Accordingly, in FIG. 6, each line represents the efficiency of the amplifier at a particular attenuation state as a function of phase shift. In FIG. 6 the attenuation values refer to attenuation along the peaking amplifier path (e.g., the attenuation of the carrier amplifier path is fixed to 0 dB).

Because each one of States 1, 2, and 3, are defined by a particular attenuation and phase state of the power splitter of the Doherty amplifier, each State can be mapped onto one of the lines of FIG. 6. Therefore, a number of points have been identified on FIG. 6, where each point is associated with one of State 1, State 2, or State 3, defined above with reference to FIG. 2. Point 615 illustrates State 1 for the amplifier. State 1 defines the phase shift of the amplifier that, at equal attenuation on each amplifier path, results in the amplifier's peak power. Point 615, therefore, demonstrates the phase shift/attenuation setting for the amplifier that defines State 1. Point 617 illustrates State 2 for the amplifier. State 2 defines the phase shift of the amplifier that, at equal attenuation on each amplifier path, results in the amplifier's highest efficiency. Point 617, therefore, demonstrates the phase shift/attenuation setting for the amplifier that defines State 2. Point 619 illustrates State 3 for the amplifier. State 3 defines the attenuation level of the amplifier that, at the phase shift defined by State 2, results in the amplifier's highest efficiency. Point 619, therefore, demonstrates the phase shift/attenuation setting for the amplifier that defines State 3.

The three points 615, 617 and 619, as illustrated in FIG. 6, define a space 621 (i.e., a triangle) within which fall a number of attenuation and phase states of the amplifier. Each state that falls within space 621 is a candidate optimal setting for the amplifier. In general, it is desirable to configure the amplifier in the most efficient state (e.g., the state closest to point 619 that falls within space 621) that still provides acceptable linearity. Therefore, as long as the linearization system of amplifier can correct the nonlinearity of the amplifier within the measured three states, the attenuator and phase shifter state is tuned towards best efficiency state identified by point 619. On the contrary, if the linearization system is not able to correct nonlinearity the attenuator and phase shifter values of the amplifier's power splitter are shifted towards the state having better linearity (e.g., towards the state defined by point 615).

Accordingly, if the attenuation and phase states associated with State 3 will result in an amplifier calibration that is not linearizable, the amplifier is adjusted towards State 1 (point 615). For example, if the amplifier is not linearizable when configured in accordance with point 619, the amplifier may be configured in accordance with the attenuation and state of point 623 (or the closest configuration possible to point 623 that falls within space 621). Then, if the amplifier is not linearizable when configured in accordance with point 623, the amplifier may be configured in accordance with the attenuation and state of point 625 (or the closest configuration possible to point 625 that falls within space 621), and so on.

The present system and method, therefore, may avoid the complexity of measuring all possible combinations of attenuator and phase shifter of a power splitter of a Doherty amplifier for attaining an optimum RF performance. By identifying States 1, 2, and 3, as described above, and selecting a state falling with an area define by those boundary states, the amplifier can quickly be configured for optimal performance. Additionally, embodiments of the present system and method can be implemented using a reduced number of standard measurement instruments, which are cost effective and widely available.

It will be appreciated that the above described system and method for calibrating and adjustable signal or power splitter operating in conjunction with a Doherty amplifier may be implemented with one or more integrated circuits or hybrid structures or combinations or the like.

An embodiment of a method of calibrating an amplifier having a first amplification path and a second amplification path includes setting an attenuation of the first amplification path to a first attenuation value and an attenuation of the second amplification path to the first attenuation value, determining a first phase shift of the first amplification path and a second phase shift of the second amplification path that meets a first performance criteria, setting a phase shift of the first amplification path to the first phase shift and a phase shift of the second amplification path to the second phase shift, and determining a first attenuation of the first amplification path and a second attenuation of the second amplification path that meets a second performance criteria.

A method of calibrating a power splitter connected to an amplifier, the amplifier having a carrier path and a peaking path includes supplying an input signal to the power splitter. The power splitter is configured to determine an attenuation and a phase shift of the carrier path and an attenuation and a phase shift of the peaking path. The method includes identifying a first state of the power splitter defining a first phase shift of the carrier path and a second phase shift of the peaking path providing a maximum efficiency of the amplifier when the attenuation of the carrier path and the attenuation of the peaking path are set to first attenuation values, and setting the attenuation of the carrier path and the attenuation of the peaking path to achieve a maximum efficiency of the amplifier when the phase shift of the carrier path and the phase shift of the peaking path are set according to the first state.

A system for calibrating and amplifier includes an amplifier having a first path and a second path, a power splitter, and a controller. The power splitter is coupled to the amplifier, and the power splitter includes a first adjustable attenuator connected to the first path, a second adjustable attenuator connected to the second path, a first adjustable phase shifter connected to the first path, and a second adjustable phase shifter connected to the second path. The controller is coupled to the first and second adjustable attenuators and the first and second adjustable phase shifters. The controller is configured to set an attenuation of the first path to a first attenuation value and an attenuation of the second path to the first attenuation value, determine a first phase shift of the first path and a second phase shift of the second path providing a maximum efficiency of the amplifier, set a phase shift of the first path to the first phase shift and a phase shift of the second path to the second phase shift, and determine a first attenuation of the first path and a second attenuation of the second path providing a maximum efficiency of the amplifier.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system, comprising:
an amplifier having a first path and a second path;
a power splitter coupled to the amplifier, the power splitter including:
   a first adjustable attenuator connected to the first path,
   a second adjustable attenuator connected to the second path,
   a first adjustable phase shifter connected to the first path, and
   a second adjustable phase shifter connected to the second path;
a controller coupled to the power splitter and including a serial peripheral interface, the controller being configured to receive instructions via the serial peripheral interface that, when executed by the controller, cause the controller to:
   set an attenuation of the first path to a first attenuation value and an attenuation of the second path to the first attenuation value,
   determine a first phase shift of the first path and a second phase shift of the second path providing a maximum efficiency of the amplifier,
   set a phase shift of the first path to the first phase shift and a phase shift of the second path to the second phase shift, and
   determine a first attenuation of the first path and a second attenuation of the second path providing a maximum efficiency of the amplifier.

2. The system of claim 1, wherein the instructions received via the serial peripheral interface cause the controller to sweep the phase shift of the first path and the phase shift of the second path through a number of candidate phase states.

3. The system of claim 2, wherein the instructions include a plurality of phase shift values corresponding to each of the candidate phase states.

4. The system of claim 1, wherein the instructions received via the serial peripheral interface cause the controller to sweep the attenuation of the first path and the attenuation of the second path through a number of candidate attenuation states.

5. The system of claim 4, wherein the instructions include a plurality of attenuation values corresponding to each of the candidate attenuation states.

6. The system of claim 1, wherein the instructions received via the serial peripheral interface cause the controller to set the attenuation of the first path to the first attenuation of the first path and the attenuation of the second path to the second attenuation of the second path.

7. The system of claim 1, wherein the first attenuation value is 0 dB.

8. The system of claim 1, wherein the serial peripheral interface is formed on a first integrated circuit chip and the controller is formed on a second integrated circuit chip.

9. The system of claim 1, wherein the serial peripheral interface and the controller are formed on a single integrated circuit chip.

10. A method of calibrating an amplifier having a first path and a second path, the method comprising:
   receiving, via a serial peripheral interface, a first instruction to set an attenuation of the first path and an attenuation of the second path are set to first attenuation values;
   after receiving the first instruction, setting the attenuation of the first path and the attenuation of the second path to the first attenuation values;
   after setting the attenuation of the first path and the attenuation of the second path to the first attenuation values, identifying a first state of the amplifier defining a first phase shift of the first path and a second phase shift of the second path resulting in a maximum efficiency of the amplifier when the attenuation of the first path and the attenuation of the second path are set to first attenuation values; and
   after identifying the first state, setting the attenuation of the first path and the attenuation of the second path to achieve a maximum efficiency of the amplifier when the phase shift of the first path and the phase shift of the second path are set according to the first state.

11. The method of claim 10, wherein identifying the first state of the amplifier includes sweeping the phase shift of the first path and the phase shift of the second path through a number of values.

12. The method of claim 11, wherein the number of values are received via the serial peripheral interface.

13. The method of claim 10, wherein the first attenuation values are 0 dB on the first path and 0 dB on the second path.

14. The method of claim 10, wherein the first attenuation values are equal.

15. The method of claim 10, including:
determining whether the amplifier is linearizable; and
when the amplifier is not linearizable, adjusting either or both the attenuation or the phase shift of either or both the first path or the second path.

16. The method of claim 15, including:
identifying a second state of the amplifier defining a third phase shift of the first path and a fourth phase shift of the second path resulting in a maximum peak output power of the amplifier when the attenuation of the first path and the attenuation of the second path are set to the first attenuation values; and
adjusting the attenuation and the phase shift of the first path and the attenuation and the phase shift of the second path towards the second state.

17. The method of claim 16, wherein identifying the second state of the amplifier includes sweeping the attenuation of the first path or the attenuation of the second path through a number of values.

18. A method of calibrating an amplifier having a first path and a second path, the method comprising:
   setting one of phase shifts of the first and second paths and attenuations of the first and second paths to a first state configured to maximize an efficiency of the amplifier when the other of the phase shifts of the first and second paths and the attenuations of the first and second paths are set to first values; and
   with the one of the phase shifts of the first and second paths and attenuations of the first and second paths set to the first state, setting the other of the phase shifts of the first and second paths and the attenuations of the first and second paths to maximize the efficiency of the amplifier.

19. The method of claim 18, including:
determining whether the amplifier is linearizable; and
when the amplifier is not linearizable, adjusting either or both the attenuation or the phase shift of either or both the first path or the second path.

20. The method of claim 18, wherein the first values are equal.

* * * * *